United States Patent
Koyama

(10) Patent No.: US 8,497,739 B2
(45) Date of Patent: Jul. 30, 2013

(54) SINGLE-DIFFERENTIAL CONVERTING CIRCUIT

(75) Inventor: Kazuo Koyama, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 68 days.

(21) Appl. No.: 13/226,693

(22) Filed: Sep. 7, 2011

(65) Prior Publication Data

US 2012/0062319 A1  Mar. 15, 2012

(30) Foreign Application Priority Data

Sep. 10, 2010 (JP) ................................. 2010-203312

(51) Int. Cl.
*H03F 3/04* (2006.01)

(52) U.S. Cl.
USPC .......................................... 330/301; 330/104

(58) Field of Classification Search
USPC ........................... 330/103, 104, 117, 258, 301
See application file for complete search history.

(56) References Cited

U.S. PATENT DOCUMENTS

| | | | |
|---|---|---|---|
| 5,070,305 A * | 12/1991 | Confalonieri et al. | ........ 330/301 |
| 5,614,864 A | 3/1997 | Stubbe et al. | |
| 6,121,809 A * | 9/2000 | Ma et al. | ........................ 327/246 |
| 6,664,854 B2 | 12/2003 | Tanaka et al. | |
| 6,853,241 B2 | 2/2005 | Fujimoto | |
| 7,106,131 B2 | 9/2006 | Lee et al. | |
| 7,728,673 B2 * | 6/2010 | Chang et al. | ................... 330/301 |
| 7,944,310 B2 * | 5/2011 | Chiu | .............................. 330/301 |

FOREIGN PATENT DOCUMENTS

| | | |
|---|---|---|
| JP | 62-168403 | 7/1987 |
| JP | 04-095406 | 3/1992 |
| JP | 4-064827 U | 6/1992 |
| JP | 5-327370 | 12/1993 |
| JP | 9-130169 | 5/1997 |
| JP | 2003-243949 | 8/2003 |
| JP | 2004-320712 | 11/2004 |
| JP | 2008-005104 | 1/2008 |
| WO | 00/044090 | 7/2000 |

\* cited by examiner

*Primary Examiner* — Khanh V Nguyen
(74) *Attorney, Agent, or Firm* — Morgan, Lewis & Bockius LLP

(57) ABSTRACT

There is provided a single-differential converting circuit that can reduce the variations in the input voltage of an operational amplifier sufficiently, made by changes in the voltages input from the exterior, while maintaining the function as the amplifier. The single-differential converting circuit is configured to include: an operational amplifier 104 provided with an inverting input terminal 104a and a noninverting input terminal 104c, for respectively receiving an input signal and a signal indicative of a reference voltage, a noninverting output terminal 104b and an inverting output terminal 104d having opposite polarities to each other; and a positive feedback impedance element 103a connected between one of the two input terminals and one, of the output terminals, having a same polarity with the above one of the two input terminals.

6 Claims, 4 Drawing Sheets

SINGLE-DIFFERENTIAL CONVERTING CIRCUIT

TECHNICAL FIELD

The present invention relates to a single-differential converting circuit for converting an input at a single end to a differential output.

BACKGROUND ART

There is known a circuit in which a signal input at a single end is amplified and converted to two signals having opposite phase polarities to each other. Such a circuit is herein referred to as a single-differential converting circuit.

FIG. 4 is a view illustrative of a conventional single-differential converting circuit. The single-differential converting circuit illustrated in FIG. 4 is provided with: a fully-differential type operational amplifier 104; two input impedance elements 101a and 101b respectively connected to an inverting input terminal 104a and a noninverting input terminal 104c of the operational amplifier 104; and two negative feedback impedance elements 102a and 102b respectively connected between the inverting input terminal 104a and a noninverting output terminal 104b, and between the noninverting input terminal 104c and an inverting output terminal 104d. Impedances of the input impedance elements 101a and 101b are both Z1, and impedances of the negative feedback impedance elements 102a and 102b are both Z2.

Additionally, $V_{ip}$ in the drawing indicates a voltage of a signal input to the single-differential converting circuit, and $V_{on}$ and $V_{op}$ indicate voltages of signals output from the single-differential converting circuit. $V_{sp}$ and $V_{sn}$ are input voltages to the operational amplifier 104. "p" and "n", each of which is a subscript indicative of physical quantity, are indicative of the phase of a voltage. The voltage indicated by the suffix "p" and the voltage indicated by the suffix "n" are ones having amplitudes inverted from each other with respect to a voltage value to be a direct current component of an alternating voltage as a reference. In other words, the phases are different by 180 degrees from each other.

Herein, the relationship between two signals having the phases different by 180 degrees from each other will be referred to as "reverse phase" or "opposite phase polarities", and the relationship between two signals having the common phases will be referred to as "common phase" or "same phase polarity". Additionally, the relationship between the common phase and the reverse phase will be referred to as "phase is inverted". Furthermore, a first terminal assigned to an input and output of a signal and a second terminal assigned to a signal having an opposite polarity to the signal of the first terminal have a relationship of "opposite polarities". Moreover, a first terminal assigned to an input and output of a signal and a second terminal assigned to a signal having the same polarity with the signal of the first terminal have a relationship of "same polarity".

In the single-differential converting circuit illustrated in FIG. 4, the input voltage $V_{sp}$ ($\approx V_{sn}$) is varied in accordance with the change in the voltage $V_{ip}$. For this reason, in the conventional art, it is necessary to design the single-differential converting circuit in consideration of the changes in $V_{sp}$ and $V_{sn}$. This produces a problem in that there are limitations in the design condition of the single-differential converting circuit of, in particular, a low voltage.

As a conventional art for the purpose of solving the above problem, an example is Patent Document 1 that discloses a circuit illustrated in, for example, FIG. 5. In Patent Document 1, there is a relationship represented by the following mathematical expression among the voltage $V_{in}$ of a signal input from the exterior and resistance values R1, R2, R3, and R4. Then, by setting the resistance values R1 to R4 to make smaller the common phase voltage VCM=$(V_{sp}+V_{sn})/2$ in the expression, the common phase voltage VCM can be made small regardless of the voltage $V_{in}$.

$$VCM/V_{in}=R3/[R1+R2(R1+R3)/(R2+R4)]\cdot R2/(R2+R4)$$

PRIOR ART DOCUMENT

Patent Document

Patent document 1: JP H09-130169 A

SUMMARY OF THE INVENTION

Problem to be Solved $VCM/V_{in}$ in the above expression can be made 0, by setting the resistance value R3 or the resistance value R2 at 0. If the resistance value R3 or the resistance value R2 is set at 0, however, the circuit illustrated in FIG. 5 will not function as an amplifier. In addition, if the resistance value R3 or the resistance value R2 is set at a small value to suppress the common phase voltage VCM to be small, the ratio between the resistance value R3 and the resistance value R1 and the ratio between the resistance value R4 and the resistance value R2 will be unbalanced. This will cause a disturbance of stable circuit operations. Therefore, the resistance value R3 or the resistance value R2 cannot be set at a small value sufficiently, thereby resulting in the difficulty of suppressing the common phase voltage VCM to be small. Specifically, in the above-described conventional art, the common phase signal VCM can be suppressed, but it cannot be suppressed to be small sufficiently. It is impossible to reduce the variations of the input voltage of the operation amplifier 404 sufficiently in accordance with the change in the voltage $V_{in}$, while maintaining the function as an amplifier. That is, in the conventional art, it is not possible to reduce the common-mode signal VCM sufficiently, while maintaining the function as an amplifier.

The present invention has been made in view of the above circumstances, and has an object of providing a single-differential converting circuit that allows the reduction in a variation of an input voltage of an operational amplifier sufficiently in accordance with the change in the voltage input from the exterior, while maintaining the function as an amplifier.

Solution to the Problem

In order to solve the above problem, according to an aspect of the present invention, there is provided a single-differential converting circuit for receiving an input signal received in a single state and outputting two output signals having opposite phase polarities to each other, the single-differential converting circuit comprising: a fully-differential type operational amplifier (for example, an operational amplifier 104 illustrated in FIG. 1) including two input terminals (for example, an inverting input terminal 104a, a noninverting input terminal 104c illustrated in FIG. 1) for respectively receiving the input signal and a signal indicative of a reference voltage, each having an opposite polarity to each other, and two output terminals (for example, a noninverting output terminal 104b, an inverting output terminal 104d illustrated in FIG. 1) having opposite polarities to each other; and a positive feedback impedance element (for example, a positive feedback impedance element 103a illustrated in FIG. 1) connected between one of the two input terminals and one, of the output terminals, having a same polarity with the above one of the two input terminals.

In addition, according to the single-differential converting circuit according to an aspect of the present invention, in the above invention, the fully-differential type operational amplifier may comprise: a first input terminal (for example, an inverting input terminal 104a illustrated in FIG. 1) for receiving a signal indicative of the input signal; a second input terminal (for example, a noninverting input terminal 104c illustrated in FIG. 1) for receiving a signal indicative of the reference voltage; a first output terminal (for example, an inverting output terminal 104d illustrated in FIG. 1) having the same polarity with the first input terminal; and a second output terminal (for example, a noninverting output terminal 104b illustrated in FIG. 1) having an opposite polarity to the first input terminal, and the converting circuit may further comprise a first negative feedback impedance element (for example, a negative feedback impedance element 102b illustrated in FIG. 1) connected between the second input terminal and the first output terminal of the operational amplifier.

Furthermore, according to the single-differential converting circuit according to an aspect of the present invention, in the above invention, preferably, an impedance value of the first negative feedback impedance element and the impedance value of the positive feedback impedance element are equal.

Moreover, the single-differential converting circuit according to an aspect of the present invention, in the above invention, may further comprising a second negative feedback impedance element (for example, a negative feedback impedance element 100 illustrated in FIG. 1) connected between the first input terminal and the second output terminal of the operational amplifier.

Additionally, according to the single-differential converting circuit according to an aspect of the present invention, in the above invention, preferably, an impedance value obtained by connecting the first negative feedback impedance element and the positive feedback impedance element in parallel with each other is equal to the impedance value of the second negative feedback impedance value.

Furthermore, in the single-differential converting circuit according to an aspect of the present invention, the second negative feedback impedance element may be connected between the first input terminal and the second output terminal of the operational amplifier, may further comprise: a third negative feedback impedance element (for example, a negative feedback impedance element 102a illustrated in FIG. 1) having an impedance value equal to the impedance value of the first negative feedback impedance element; and a fourth negative feedback impedance element (for example, a negative feedback impedance element 103b illustrated in FIG. 1) having an impedance value equal to the impedance value of the positive feedback impedance element.

Moreover, the converting circuit according to an aspect of the present invention, in the above invention, may further comprise: a first input impedance element (for example, an input impedance element 101a illustrated in FIG. 1) connected to the first input terminal of the operational amplifier; and a second input impedance element (for example, an input impedance element 101b illustrated in FIG. 1) connected to the second input terminal, wherein the impedance value of the first input impedance element and the impedance value of the second input impedance element may be equal.

According to an aspect of the present invention, there is provided a single-differential converting circuit comprising: a fully-differential type operational amplifier (for example, an operational amplifier 104 illustrated in FIG. 1) including a first input terminal (for example, an inverting input terminal 104a illustrated in FIG. 1), a second input terminal (for example, a noninverting input terminal 104c illustrated in FIG. 1), a first output terminal (for example, a noninverting output terminal 104d illustrated in FIG. 1) having a same polarity with the first input terminal, and a second output terminal (for example, a noninverting output terminal 104b illustrated in FIG. 1) having an opposite polarity to the first input terminal; a first input impedance element (for example, an input impedance element 101a illustrated in FIG. 1) having one end receiving an input signal and the other end connected to the first input terminal; a second input terminal (for example, an input impedance element 101b illustrated in FIG. 1) having one end receiving a reference voltage and the other end connected the second input terminal; a first negative feedback impedance element (for example, a negative feedback impedance element 102b illustrated in FIG. 1) connected between the second input terminal and the first output terminal; a second negative feedback impedance element (for example, a negative feedback impedance element 100 illustrated in FIG. 1) connected between the first input terminal and the second output terminal; and a positive feedback impedance (for example, positive feedback impedance element 103a illustrated in FIG. 1) connected between the second input terminal and the second output terminal, wherein the second negative feedback element includes a third negative feedback element (for example, a negative feedback impedance element 103b illustrated in FIG. 1) and a fourth negative feedback element (for example, a negative feedback impedance element 102a illustrated in FIG. 1), wherein an impedance value of the first negative feedback element and an impedance value of the third negative feedback element are equal, and wherein an impedance value of the positive feedback element and an impedance element of the fourth negative feedback element are equal.

In addition, in the single-differential converting circuit according to an aspect of the present invention, in the above invention, preferably, the impedance value of the positive feedback impedance element and the impedance value of the first negative feedback impedance element are equal.

Furthermore, in the single-differential converting circuit according to an aspect of the present invention, in the above invention, preferably, an impedance value of the first input impedance element and the impedance value of the second input impedance element are equal.

According to an aspect of the present invention, there is provided a single-differential converting circuit comprising: a fully-differential type operational amplifier (for example, an operational amplifier 104 illustrated in FIG. 1) including a first input terminal (for example, an inverting input terminal 104a illustrated in FIG. 1), a second input terminal (for example, a noninverting input terminal 104c illustrated in FIG. 1), a first output terminal (for example, an inverting output terminal 104d illustrated in FIG. 1) having a same polarity with the first input terminal, and a second output terminal (for example, a noninverting output terminal 104b illustrated in FIG. 1) having an opposite polarity to the first input terminal; a first input impedance element (for example, an input impedance element 101a illustrated in FIG. 1) having one end receiving an input signal and the other end connected to the first input terminal; a second input terminal (for example, an input impedance element 101b illustrated in FIG. 1) having one end receiving a reference voltage and the other end connected the second input terminal; a first negative feedback impedance element (for example, a negative feedback impedance element 102b illustrated in FIG. 1) connected between the second input terminal and the first output terminal; a second negative feedback impedance element (for example, a negative feedback impedance element 100 illustrated in FIG. 1) connected between the first input terminal and the second output terminal; and a positive feedback impedance (for example, positive feedback impedance element 103a illustrated in FIG. 1) connected between the second input terminal and the second output terminal, wherein an impedance value obtained by connecting the first negative feedback impedance element and the positive feedback impedance element in parallel with each other is equal to the impedance value of the second negative feedback impedance element.

In addition, in the single-differential converting circuit according to an aspect of the present invention, in the above invention, preferably, the impedance value of the positive feedback impedance element and the impedance value of the first negative feedback impedance element are equal.

Furthermore, in the single-differential converting circuit according to an aspect of the present invention, in the above invention, preferably, an impedance value of the first input impedance element and the impedance value of the second input impedance element are equal.

Advantageous Effects of the Invention

According to an aspect of the single-differential converting circuit described heretofore, even if the voltage input to the single-differential converting circuit from the exterior changes, it is possible to reduce the variation in the input voltage of the operational amplifier sufficiently in accordance with the change in the voltage with the function as an amplifier maintained. According to the present invention, it is possible to provide a single-differential converting circuit that can reduce the variation in the input voltage of the operational amplifier sufficiently in accordance with the change in the voltage with the function as an amplifier maintained.

Additionally, with such a single-differential converting circuit according to the present invention, it is only necessary for the operational amplifier to operate with a prescribed input voltage that is not changed as a reference. Therefore, it is made possible to employ an amplifier with a narrow common-mode input range as an operational amplifier, thereby improving the design flexibility of a single-differential converting circuit.

DESCRIPTION OF EMBODIMENTS

Hereinafter, an embodiment of the present invention will be described with reference to the drawings.
(Circuit Configuration)

Figure 1:
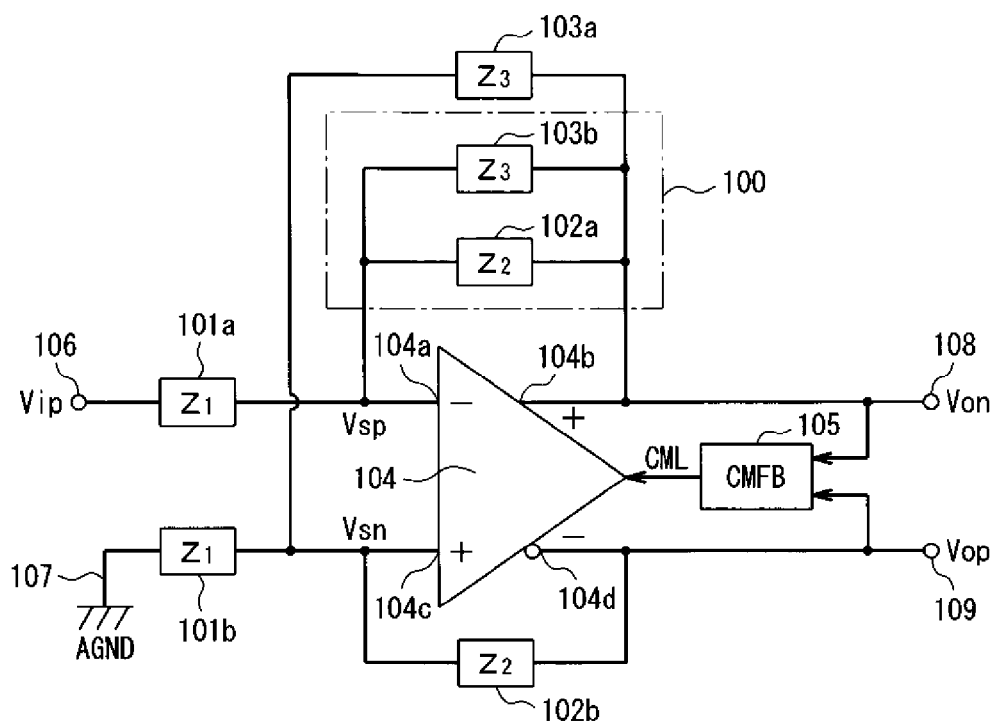
FIG. 1 is a view illustrative of a single-differential converting circuit according to an embodiment of the present invention.

FIG. 1 is a view illustrative of a single-differential converting circuit according to the present embodiment. The single-differential converting circuit illustrated in FIG. 1 includes: an operational amplifier 104; two input impedance elements 101a and 101b, negative feedback impedance elements 100 and 102b; a positive feedback impedance element 103a; and a common-mode feedback (indicated as CMFB in the drawing) circuit 105. The negative feedback impedance element 100 includes negative feedback impedance elements 102a and 103b. The common-mode feedback circuit 105 is a circuit for detecting a common-mode voltage output from the operational amplifier 104 to make a feedback thereof. The common-mode feedback circuit 105 allows the output common-mode voltage to be kept at a certain value.

The operational amplifier 104 is a fully-differential type operational amplifier and is provided with: an inverting input terminal 104a; a noninverting input terminal 104c having an opposite polarity from the inverting input terminal 104a; a noninverting output terminal 104b; and an inverting output terminal 104d having an opposite polarity from the noninverting output terminal 104b. The inverting input terminal 104a is connected to a signal input terminal 106 through the input impedance element 101a. In addition, a signal of the voltage $V_{ip}$ is input to the signal input terminal 106 from the exterior.

A negative feedback impedance element 102a is connected between the inverting input terminal 104a and the noninverting output terminal 104b. The noninverting output terminal 104b is connected to a signal output terminal 108. In this situation, the voltage output from the signal output terminal 108 is $V_{on}$.

The noninverting input terminal 104c is connected to a signal input terminal 107 through an input impedance element 101b. Analog ground is applied to the signal input terminal 107.

The negative feedback impedance element 102b is connected between the noninverting input terminal 104c and the inverting output terminal 104d. The inverting output terminal 104d is connected to a signal output terminal 109. In this situation, the voltage output from the signal output terminal 109 is $V_{op}$.

In addition, in the present embodiment, the negative feedback impedance element 103b is connected between the inverting input terminal 104a and the noninverting output terminal 104b, and the positive feedback impedance element 103a is connected between the noninverting input terminal 104c and the noninverting output terminal 104b, the noninverting input terminal 104c and the noninverting output terminal 104b having the same polarity.

In the above-described impedances, according to the present embodiment, Z1 denotes the impedance values of the input impedance elements 101a and 101b, Z2 denotes the impedance values of the negative feedback impedance elements 102a and 102b, and Z3 denotes the impedance values of the positive feedback impedance elements 103a and the negative feedback impedance element 103b.

Specifically, when the ratio between the impedance value of the input impedance element 101a and that of the input impedance element 101b, the ratio between the impedance value of the negative feedback impedance 102a and that of the negative feedback impedance element 102b, and the ratio between the impedance value of the positive feedback impedance element 103a and that of the negative feedback impedance element 103b are equal to one another, this will produce the same effect with a case where the impedance values of the input impedance elements 101a and 101b are the same, the impedance values of the negative feedback impedance elements 102a and 102b are the same, and the impedance values of the positive feedback impedance element 103a and the negative feedback impedance element 103b are the same.

The inverting input terminal 104a and the noninverting input terminal 104c of the operational amplifier 104 have opposite polarities to each other, and receive an input signal and a signal indicative of the reference voltage, respectively. In addition, signal output terminals 108 and 109 output signals having opposite phase polarities to each other. The suffixes "n" and "p" indicate the phase polarity of a signal, and the signal with the suffix "n" and the signal with the suffix "p" have opposite polarities to each other. The signals with the same suffixes "n" and the signals with the same suffixes "p" have the same polarities, respectively.

With the single-differential converting circuit having the above-described configuration, there are provided the positive feedback impedance element 103a and the negative feedback impedance element 103b, the positive feedback impedance element 103a being connected between one input terminal of the two input terminals and an output terminal having the same polarity with the above one input terminal. It is therefore possible to make a feedback for the nodes connected to the inverting input terminal 104a and the noninverting input terminal 104c. Accordingly, even if the voltage $V_{ip}$ changes, the positive feedback impedance element 103a and the negative feedback impedance element 103b are capable of making a feedback in accordance with the change to suppress the variations in the input voltages $V_{sn}$ and $V_{sp}$ of the operational amplifier.

Figure 2:
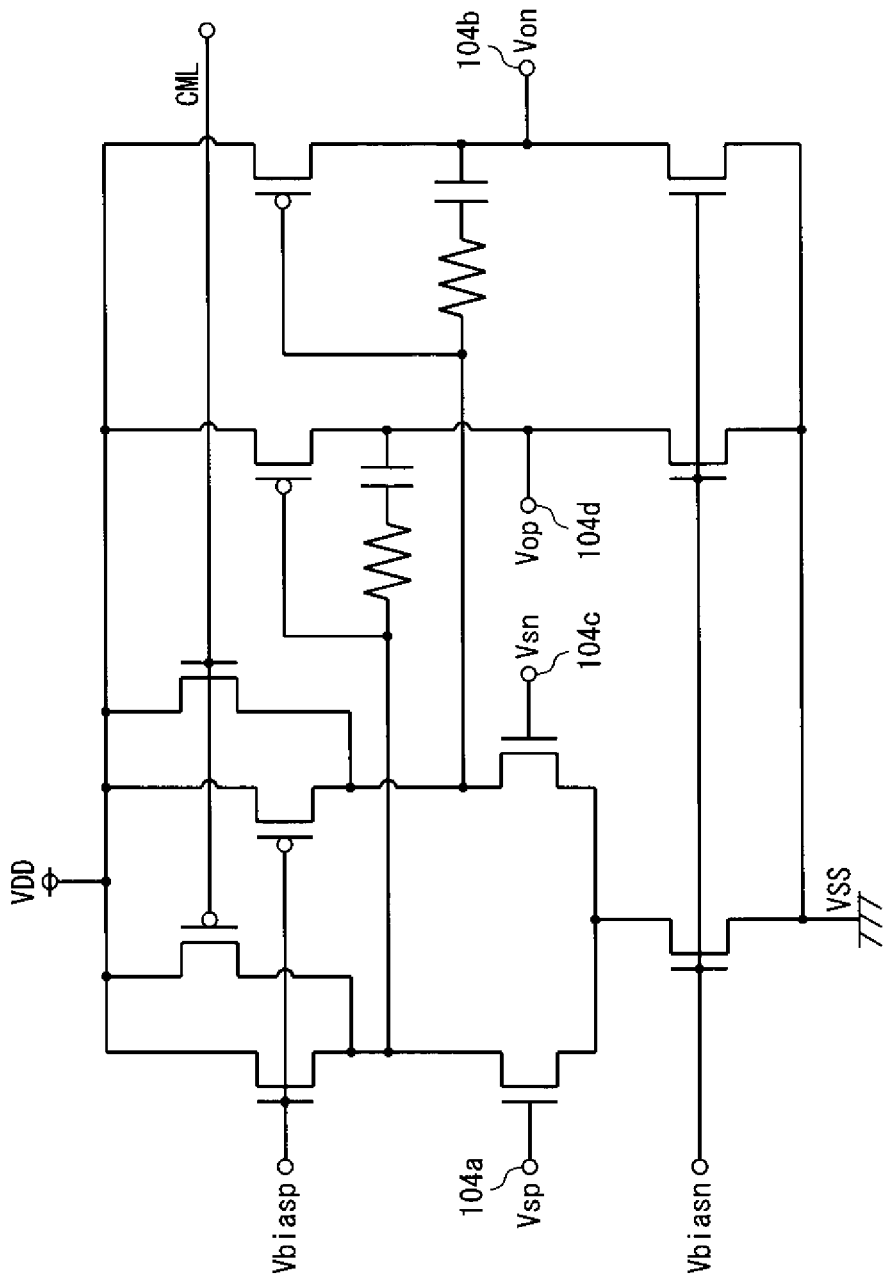
FIG. 2 is a circuit diagram illustrative of the interior of the operational amplifier illustrated in FIG. 1.
Figure 3:
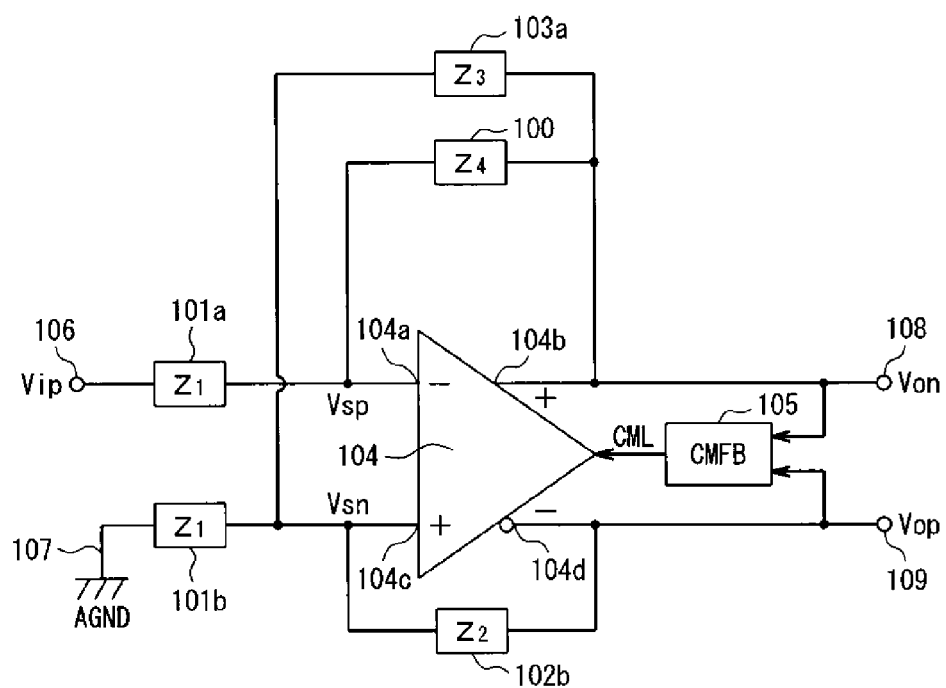
FIG. 3 is a view illustrative of a single-differential converting circuit, according to the present embodiment of the present invention, in which a negative feedback impedance element 100 is configured with a single element.

FIG. 2 is a circuit diagram illustrative of the interior of the operational amplifier 104 illustrated in FIG. 1. The input terminals 104a and 104c and the output terminals 104b and 104d correspond to those having the same names of FIG. 1.

In addition, as illustrated, the operational amplifier 104 is supplied with a positive power supply voltage VDD, a negative power supply voltage VSS, and $V_{biasp}$ and $V_{biasn}$ for determining the current flowing through the operational amplifier 104.

(Operation)

Next, the operation of the single-differential converting circuit described heretofore according to the present embodiment will be described together with mathematical expressions.

(1) Operation of the Conventional Single-Differential Converting Circuit Now, in order to compare with the operation of the single-differential converting circuit according to the present embodiment, firstly, the operation of the conventional single-differential converting circuit illustrated in FIG. 4 will be described with reference to expressions. Specifically, $V_{ip}$, $V_{on}$, $V_{in}$, $V_{op}$, $V_{sn}$, $V_{sp}$, Z1, Z2, and Z3 each indicate a physical quantity in the description of FIG. 4.

Figure 4:
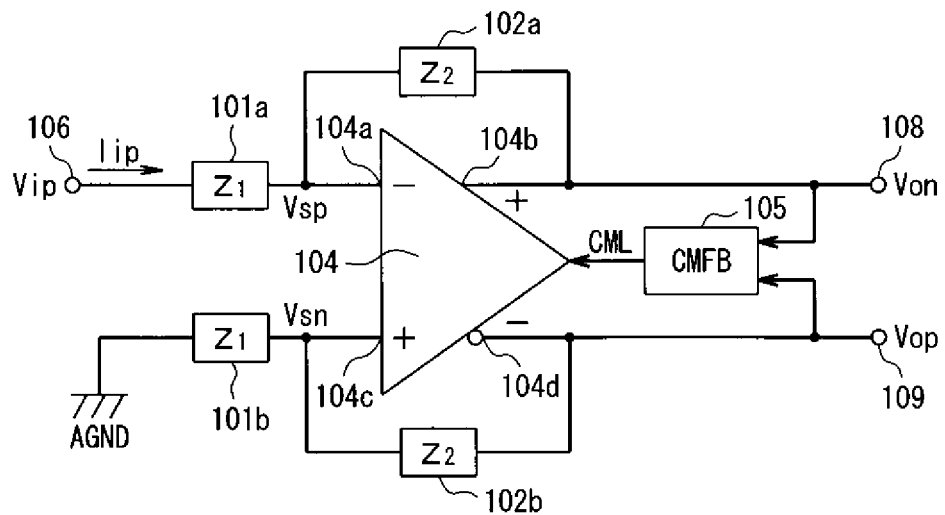
FIG. 4 is a view illustrative of a conventional common single-differential converting circuit.
Figure 5:
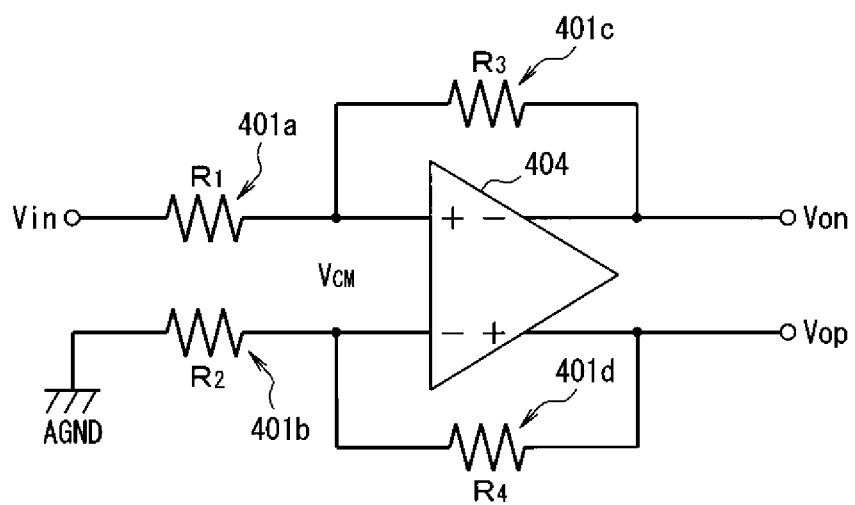
FIG. 5 is a view illustrative of a conventional art.

In the conventional single-differential converting circuit illustrated in FIG. 4, the following expression represents a condition where the total amount of current flowing to the node, to which $V_{sp}$ of FIG. 4 is applied in accordance with Kirchhoff's laws, becomes 0.

$(V_{ip}-V_{sp})/Z1+(V_{on}-V_{sp})/Z2=0$

By changing the above expression, the expression (1) is obtained.

$(1/Z1+1/Z2)V_{sp}=V_{ip}/Z1+V_{on}/Z2$   expression (1)

Likewise, as to the current flowing to the node to which $V_{sn}$ of FIG. 4 is applied, the following expression (2) is obtained.

$0-V_{sn}/Z1+(V_{op}-V_{sn})/Z2=0$ $(1/Z1+1/Z2)V_{sn}=V_{op}/Z2$   expression (2)

To calculate the differential output voltage $V_{op}-V_{on}$, both sides of the expression (2) are subtracted from the expression (1).

The result is $(1/Z1+1/Z2)(V_{sp}-V_{sn})=V_{ip}/Z1+(V_{on}-V_{op})/Z2$.

If the gain of the operational amplifier 104 is sufficiently high, $V_{sp}=V_{sn}$ can be deemed and the expression (3) is obtained.

$V_{op}-V_{on}=(Z2/Z1)V_{ip}$   expression (3)

Meanwhile, in order to obtain the input voltages $V_{sp}$ and $V_{sn}$ of the operational amplifier 104, both sides of the expression (1) and the expression (2) are added to each other and the following expression is obtained.

$(1/Z1+1/Z2)(V_{sp}+V_{sn})=V_{ip}/Z1+(V_{on}+V_{op})/Z2$

By changing the above expression, the expression (4) is obtained.

$$1/2/(V_{sp}+V_{sn}) = V_{ip}/Z1/2/(1/Z1+1/Z2) +$$
$$(V_{op}+V_{on})/Z2/2/(1/Z1+1/Z2)$$
$$= Z2V_{ip}/2/(Z1+Z2) +$$
$$Z1(V_{op}+V_{on})/2/(Z1+Z2)$$

expression (4)

In this process, $(V_{op}+V_{on})/2$ represents an output common voltage of the single-differential converting circuit illustrated in FIG. 4. The single-differential converting circuit illustrated in FIG. 4 is controlled so that the common voltage becomes an analog ground (=0) by use of the common-mode feedback circuit 105. Moreover, in the single-differential converting circuit illustrated in FIG. 4, only the relationship between the impedance values Z1 and Z2 determines the differential output voltage ($V_{op}-V_{on}$), but does not determine $V_{op}$ or $V_{on}$ uniquely. The common-mode feedback circuit 105 is a circuit for determining the common voltage of $V_{op}$ and $V_{on}$.

If the gain of the operational amplifier 104 is sufficiently high, $V_{sp}=V_{sn}$ can be deemed and the left side of the expression (4) is considered $V_{sp}$ (=$V_{sn}$). Accordingly, the following expression (5) is obtainable from the expression (4).

$V_{sp}=V_{sn}=Z2 \cdot V_{ip}/2/(Z1+Z2)$   expression (5)

In the conventional single-differential converting circuit illustrated in FIG. 4, the expression (5) exhibits that the input voltage $V_{sp}$ (=$V_{sn}$) of the operational amplifier 104 varies depending on the voltage $V_{ip}$ of the signal input from the exterior.

(2) Operation of the Single-Differential Converting Circuit According to the Present Embodiment Next, the operation of the single-differential converting circuit illustrated in FIG. 1 according to the present embodiment will be described.

In the single-differential converting circuit illustrated in FIG. 1, the following expression represents a condition where the total amount of current flowing to the node, to which the signal of $V_{sp}$ is input, in accordance with Kirchhoff's laws, becomes 0.

$(V_{ip}-V_{sp})/Z1+(V_{on}-V_{sp})/Z2+(V_{on}-V_{sp})/Z3=0$

The expression (6) is obtained by changing the above expression.

$$V_{sp}(1/Z1+1/Z2+1/Z3)=V_{ip}/Z1+V_{on}/Z2+V_{on}/Z3 \quad \text{expression (6)}$$

Likewise, as to the node to which $V_{on}$ is input, the following expression (7) is obtained.

$$(0-V_{sn})/Z1+(V_{op}-V_{on})/Z2+(V_{on}-V_{on})/Z3=0$$

$$V_{sn}(1/Z1+1/Z2+1/Z3)=V_{op}/Z2+V_{on}/Z3 \quad \text{expression (7)}$$

To calculate the differential output voltage $V_{op}-V_{on}$, both sides of the expression (7) is subtracted from the expression (6).

$$(1/Z1+1/Z2+1/Z3)(V_{sp}-V_{sn})=V_{ip}/Z1+(V_{on}-V_{op})/Z2$$

In the above expression, if the gain of the operational amplifier 104 is sufficiently high, $V_{sp}=V_{sn}$ can be deemed. Then, the expression (8) is obtained.

$$V_{op}-V_{on}=Z2\cdot V_{ip}/Z1 \quad \text{expression (8)}$$

Since the expression (8) is same with the expression (3) in the conventional circuit, the present embodiment has the same gain with that of the conventional circuit. Since $V_{op}=-V_{on}$ is satisfied in the expression (8), the following expression (9) is obtainable.

$$V_{op}=-V_{on}=Z2\cdot V_{ip}/2/Z1 \quad \text{expression (9)}$$

Meanwhile, in order to obtain the input voltages $V_{sp}$ and $V_{sn}$ of the operational amplifier 104, both sides of the expression (6) and the expression (7) are added to each other. As a result of addition, and the expression (10) is obtained.

$$(1/Z1+1/Z2+1/Z3)(V_{sp}+V_{sn})=(V_{ip}/Z1)+(V_{on}+V_{op})/Z2+2V_{on}/Z3 \quad \text{expression (10)}$$

Since $(V_{op}+V_{on})/2=0$ is satisfied, the following expression (11) is obtainable by the expressions (9) and (10).

$$(1/Z1+1/Z2+1/Z3)(V_{sp}+V_{sn})=V_{ip}/Z1-Z2\cdot V_{ip}/Z1/Z3=(1/Z1-Z2/Z1/Z3)V_{ip} \quad \text{expression (11)}$$

In the expression (11), as to $V_{sp}$ and $V_{sn}$, if the gain of the operational amplifier 104 is sufficiently high, $V_{sp}=V_{sn}$ can be deemed. In this situation, the expression (12) is obtainable from the expression (11).

$$V_{sp}=V_{sn}=[(1/Z1-Z2/Z1/Z3)V_{ip}/2]/(1/Z1+1/Z2+1/Z3) \quad \text{expression (12)}$$

In the expression (12), when the impedance values Z3 and Z2 are the same, $$V_{sp}=V_{sn}=0 \quad \text{expression (13)}$$

is satisfied.

That is, according to the present embodiment, the impedance value Z2 of the impedance elements 102a and 102b is made equal to the impedance value Z3 of the positive feedback impedance element 103a, thereby enabling the input voltages $V_{sp}$ and $V_{sn}$ not to be dependent on the voltage $V_{ip}$ input from the exterior. Thus, according to the embodiment where the input voltages $V_{sp}$ and $V_{sn}$ are not dependent on the voltage $V_{ip}$ input from the exterior, the variations in the input voltages $V_{sp}$ and $V_{sn}$ made in accordance with the voltage $V_{ip}$ can be eliminated completely while maintaining the function as an amplifier.

In addition, in the expression (12), when the impedance values Z3 and Z2 are set to have close values, $$V_{sp}=V_{sn}\approx 0 \quad \text{expression (14)}$$

is satisfied.

In other words, in the present embodiment, when the impedance value Z2 of the impedance elements 102a and 102b and the impedance value Z3 of the impedance element 103a have close values, the variations in the input voltages $V_{sp}$ and $V_{sn}$ made in accordance with the voltage $V_{ip}$ can be reduced sufficiently while maintaining the function as an amplifier.

Moreover, the present embodiment is not limited to the above-described configuration. That is, according to the present embodiment, the negative feedback impedance element 100 is configured with the two elements of the negative feedback impedance elements 102a and 103b. As illustrated in FIG. 1, however, the negative feedback impedance element 100 can be configured as a single element having an impedance value obtainable when the negative feedback impedance elements 102a and 103b are connected in parallel. However, the impedance value Z4 of the negative feedback impedance element 100 satisfies the expression (15).

$$Z4=Z2\cdot Z3/(Z2+Z3) \quad \text{expression (15)}$$

INDUSTRIAL AVAILABILITY

The single-differential converting circuit according to an embodiment described heretofore is applicable to any type of single-differential converting circuit, as long as it is preferable that an input voltage of an operational amplifier is not varied in accordance with the change in the voltage input from the exterior.

| Reference Signs List | |
|---|---|
| 101a, 101b | input impedance element |
| 102a, 102b, 103b | negative feedback impedance element |
| 103a | positive feedback impedance element |
| 104 | operational amplifier |
| 104a | inverting input terminal |
| 104b | noninverting output terminal |
| 104c | noninverting input terminal |
| 104d | inverting output terminal |
| 105 | common-mode feedback circuit |
| 106, 107 | signal input terminal |
| 108, 109 | signal output terminal |

The invention claimed is:

1. A single-differential converting circuit comprising:
a fully-differential type operational amplifier including a first input terminal, a second input terminal, a first output terminal having a same polarity with the first input terminal, and a second output terminal having an opposite polarity to the first input terminal;
a first input impedance element having one end receiving an input signal and the other end connected to the first input terminal;
a second input impedance element having one end receiving a reference voltage and the other end connected the second input terminal;
a first negative feedback impedance element connected between the second input terminal and the first output terminal;
a second negative feedback impedance element connected between the first input terminal and the second output terminal; and
a positive feedback impedance element connected between the second input terminal and the second output terminal,
wherein the second negative feedback impedance element includes a third negative feedback element and a fourth negative feedback element, wherein an impedance value of the first negative feedback impedance element and an impedance value of the third negative feedback element are equal, and wherein an impedance value of the positive feedback impedance element and an impedance element of the fourth negative feedback element are equal.

2. The single-differential converting circuit according to claim 1, wherein the impedance value of the positive feedback impedance element and the impedance value of the first negative feedback impedance element are equal.

3. The single-differential converting circuit according to claim 2, wherein an impedance value of the first input impedance element and the impedance value of the second input impedance element are equal.

4. A single-differential converting circuit comprising:
a fully-differential type operational amplifier including a first input terminal, a second input terminal, a first output terminal having a same polarity with the first input terminal, and a second output terminal having an opposite polarity to the first input terminal;
a first input impedance element having one end receiving an input signal and the other end connected to the first input terminal;
a second input impedance element having one end receiving a reference voltage and the other end connected the second input terminal;
a first negative feedback impedance element connected between the second input terminal and the first output terminal;
a second negative feedback impedance element connected between the first input terminal and the second output terminal; and
a positive feedback impedance element connected between the second input terminal and the second output terminal,
wherein an impedance value obtained by connecting the first negative feedback impedance element and the positive feedback impedance element in parallel with each other is equal to the impedance value of the second negative feedback impedance element.

5. The single-differential converting circuit according to claim 4, wherein the impedance value of the positive feedback impedance element and the impedance value of the first negative feedback impedance element are equal.

6. The single-differential converting circuit according to claim 5, wherein an impedance value of the first input impedance element and the impedance value of the second input impedance element are equal.

* * * * *